US006557163B1

(12) United States Patent
Rankin et al.

(10) Patent No.: US 6,557,163 B1
(45) Date of Patent: Apr. 29, 2003

(54) METHOD OF PHOTOLITHOGRAPHIC CRITICAL DIMENSION CONTROL BY USING RETICLE MEASUREMENTS IN A CONTROL ALGORITHM

(75) Inventors: Jed H. Rankin, South Burlington, VT (US); Craig E. Schneider, Underhill, VT (US); John S. Smyth, Milton, VT (US); Andrew J. Watts, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/997,904

(22) Filed: Nov. 30, 2001

(51) Int. Cl.[7] .............................................. G06F 17/50
(52) U.S. Cl. .............................. 716/21; 716/19; 716/20
(58) Field of Search .............................. 700/121; 716/4, 716/19–21; 430/22, 311; 378/34; 702/85

(56) References Cited

U.S. PATENT DOCUMENTS

| 5,497,331 A | * | 3/1996 | Iriki et al. ................... 700/121 |
| 5,617,340 A | * | 4/1997 | Cresswell et al. ............ 702/85 |
| 5,656,182 A | | 8/1997 | Marchman et al. ............ 430/4 |
| 5,968,693 A | | 10/1999 | Adams ........................ 430/30 |
| 5,969,972 A | | 10/1999 | Kerszykowski et al. ..... 700/121 |
| 5,981,119 A | | 11/1999 | Adams ........................ 430/30 |
| 5,989,764 A | | 11/1999 | Adams ........................ 430/30 |
| 5,993,043 A | * | 11/1999 | Fujii .......................... 700/121 |
| 6,078,641 A | * | 6/2000 | Mitsui et al. ................. 378/34 |
| 6,192,290 B1 | * | 2/2001 | Adams ........................ 700/121 |
| 6,225,001 B1 | | 5/2001 | Gotoh et al. ................. 429/234 |
| 6,295,629 B1 | * | 9/2001 | Suganaga ...................... 716/4 |
| 6,426,174 B1 | * | 7/2002 | Kamiya ...................... 430/311 |

FOREIGN PATENT DOCUMENTS

| JP | 5102000 | 4/1993 |
| JP | 6005488 | 1/1994 |
| JP | 6019115 | 1/1994 |

* cited by examiner

Primary Examiner—Vuthe Siek
Assistant Examiner—Naum B Levin
(74) Attorney, Agent, or Firm—Scully, Scott, Murphy & Presser; William D. Sabo, Esq.

(57) ABSTRACT

A method of implementing a new reticle for manufacturing semiconductors on a wafer which involves performing measurements on the reticle and assigning an initial exposure dose by using a predetermined algorithm. The exposure control system utilizes reticle CD data for automatically calculating reticle exposure offset values, i.e. reticle factors. A correlation of reticle size deviations to calculated reticle factors is used to derive a reticle factor for the new reticle. The derived reticle factor is then used to predict an initial exposure condition for the new reticle which is applied to the lithography tool for achieving a wafer design dimension.

20 Claims, 5 Drawing Sheets

METHOD OF PHOTOLITHOGRAPHIC CRITICAL DIMENSION CONTROL BY USING RETICLE MEASUREMENTS IN A CONTROL ALGORITHM

BACKGROUND OF THE INVENTION

1. Field of the Invention

The present invention broadly relates to the field of photolithography; and more particularly, to a method of obtaining a wafer design dimension through a process control system that uses a simple control algorithm and feedback. The feedback utilizes mask design data, mask dimension data and historical wafer feature measurements to center Critical Dimensions (CD) to a wafer feature design dimension. The present invention, utilizing distinct reticle measurements offers a method of controlling the feature size, i.e., Critical Dimension of a line or space, by assuring that the correct exposure conditions are used for each wafer processed.

2. Background of the Invention

In the field of integrated circuits (ICs), photolithography is used to transfer patterns, i.e. images, from a mask containing circuit-design information to thin films on the surface of a substrate, e.g. Si wafer. The pattern transfer is accomplished with a photoresist (e.g., an ultraviolet light-sensitive organic polymer). In a typical image transfer process, a substrate that is coated with a photoresist is illuminated through a mask, i.e., reticle, and the mask pattern is transferred to the photoresist by chemical developers. Hereinafter, the term "reticle" and the term "mask" may be used interchangeably. Further pattern transfer is accomplished using a chemical etchant.

In current technologies, this masking process usually is repeated multiple times in the fabrication of an integrated circuit.

FIG. 1 illustrates a photolithographic processing (fab) environment comprising a reticle 80 having, for instance, a measured error, i.e., deviation 100 from the design dimension 120, a stepper device 90 with lens 140 through which the exposure condition representing an exposure energy 130 is focused on a wafer 95 coated with a photoresist 150, resulting in a printed wafer at design dimension 160.

It is well known in the field of photolithography that Critical Dimension control is most difficult and challenging in a logic fab where many products are processed simultaneously. With more and more products being introduced into the fab, each with multiple masking layers and unique CD customization, calculations for exposure dose have also increased in complexity. Considering that additional lithography tools and tool types, each with their own calibrations and process variability had to be introduced to track increased volumes and complexity of manufacture, the need for CD control in the fab has transformed into a critical challenge that must be addressed. Given that a significant number of all tool/reticle setups use a particular reticle for the first time, and that a significant number of passes is required to center a product to its target Critical Dimension, there exists a critical need to reduce the errors in the initial production of products using new reticle/tool combinations.

A related art technique for CD control in the fab is described in Adams (U.S. Pat. No. 5,989,764) which is directed to a lithography tool adjustment method through scattered energy measurement. This process however, does not include using reticle size data in a feedback loop to center CD distributions.

Another related art method is described in Hitachi (U.S. Pat. No. 6,225,011) which utilizes a plurality of exposure systems. Again, the reticle size data is not used for Critical Dimension control in this technique.

A further related method disclosed in Kerszykowski (U.S. Pat. No. 5,969,972), involves an automatic machine program generator for use in manufacturing a semiconductor component. While this related art method discloses an optimizer, the optimizer fails to address the need for CD control where a reticle dimension differs from design targets, and where a new reticle has no history with any of the tools that may use the reticle.

Another related art technique described in Marchman (U.S. Pat. No. 5,656,182) utilizes feedback control, however, does not address attainment of the optimum CD. Rather it merely performs stage position control as a function of the latent image produced in the substrate.

While it is well known in the art that an exposure dose bias can be used to compensate for the wafer measurement deviation, and further that reticle factors for previously used reticles can be derived from historical wafer measurements using a feedback exposure control loop, there remains the problem of determining the correct exposure dose bias without the necessity of send-ahead or test wafers for new reticles and products.

FIG. 2 illustrates a feedback system that uses historical dimension data for each reticle and stepper tool. For a mature product, the critical dimension metrology step 210 produces historical data 220 on the mature product which is feedback resulting in feedback calculations 230 which produce the exposure dose setting 240. The mature product does not require a rework step, thus the exposure dose setting 240 is considered to be an optimum dose, calculated using the feedback exposure control loop.

FIG. 3 illustrates the prior art method where there is a new product or new reticle to be used with stepper tool 300. As shown, Critical Dimension Metrology step 310 is performed while there is no historical data from the new tool 305. This requires the first run to use historical data from other tool/reticle combinations 340 which are used in the feedback calculations 360 to produce exposure dose setting 370. Typically, this feedback arrangement does not account for new mask offsets and the resulting product run does not meet design dimension specification 160 of FIG. 1. Any product failing the design dimension specification is reworked 320 allowing later production runs 330 to benefit from production data 350 for the new reticle.

In view of the above mentioned drawbacks with related art techniques, there exists a need for providing CD control which can successfully predict initial exposure doses with new reticle/tool combinations, thereby facilitating reduced cycle times in a high volume, high complexity fab environment. That is, a method is required which is capable of using the measured and design dimensions of a reticle as input to the method, with appropriate feedback parameters, for producing an optimum exposure dose setting.

SUMMARY OF THE INVENTION

It is an object of the present invention to provide a photolithographic system and process that enables the reduction of CD errors when producing integrated circuit products using new reticle/tool combinations.

A further object of the present invention is to provide a photolithographic system and process which minimizes the difference between a manufactured CD from an established target CD where there exists a deviation in the actual CD measurement of a reticle versus its design specification.

Another object of the present invention is to provide a method for setting photolithographic exposure doses that achieves a wafer feature size that meets the wafer design specification, i.e. the design dimension +/- the required tolerance for a given semiconductor product.

A further object of the present invention is to eliminate the necessity for the standard send-ahead process and attendant rework step (320 of FIG. 3) following the required CD metrology step (310 of FIG. 3), thereby reducing process cycle times.

These and other objects and advantages can be obtained in the present invention by utilizing a metrological-feedback method, i.e., a control algorithm, wherein the reticle measurements are used as part of a feedback mechanism for exposure control, including the steps of calculating an initial exposure dose, thereby controlling the CD feature size and eliminating the need for send-ahead wafers. The observed correlation between the actual reticle CD divided by the design reticle CD and reticle factors, i.e. required exposure conditions of a particular reticle relative to the required exposure conditions of similar reticles, of the feedback system is utilized to converge on an optimum exposure dose or exposure condition, i.e. Optimum Dose, in a single pass.

Specifically, for each reticle used in production, reticle factors are calculated and stored in a database. For reticles lacking suitable recent historical wafer data on a given photolithographic tool, the calculated reticle factors are then used to arrive at an optimum exposure condition. However, for a new reticle a correlation is computed between size deviations of similar reticles and their reticle factors. Since the measured dimension and design dimension of the new reticle is known, a derived reticle factor is "picked off" from the historical correlation data. The derived reticle factor is then seeded into a feedback exposure control loop and used to calculate an initial exposure condition for the new reticle.

BRIEF DESCRIPTION OF THE DRAWINGS

The present invention, which provides a photolithographic method of Critical Dimension control, i.e. CD control, will now be described in more detail by referring to the drawings that accompany the present application. It is noted that in the accompanying drawings like reference numerals are used for describing like and corresponding elements thereof.

DETAILED DESCRIPTION OF THE INVENTION

Figure 4:
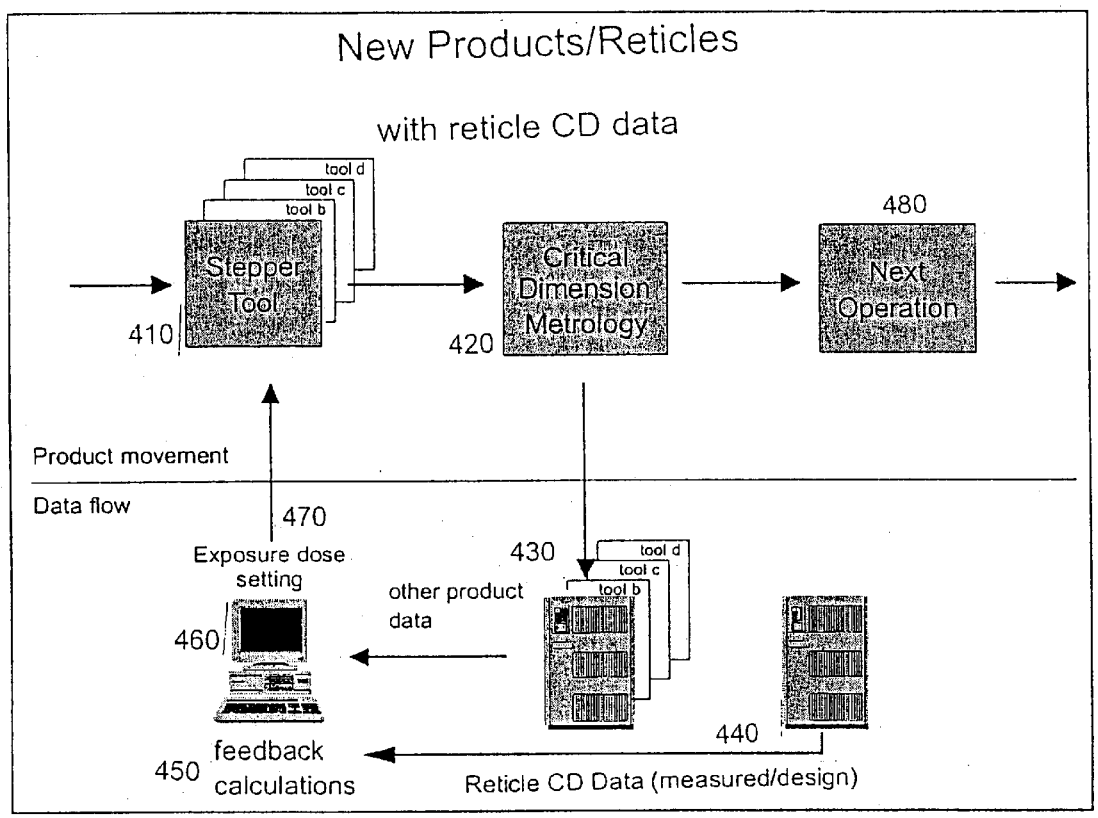
FIG. 4 illustrates the inventive control method of using reticle CD data as part of the feedback calculations for an optimum exposure dose setting.

In accordance with the present invention as illustrated in FIG. 4, metrology data taken at the Critical Dimension metrology step 420 is recorded as product history data 430. This data is blended algorithmically with reticle CD data of similar reticles, i.e., reticles with the same technology and level, 440 as part of the feedback calculations to adjust the exposure dose setting. The initial exposure dose calculated by the present invention eliminates the need to perform a first run rework for production runs. Reticle dimension data, reticle factors, historical wafer exposure conditions and historical wafer dimension data, are stored in the database for each reticle. These data are used when a particular reticle is required for a given run.

Figure 1:
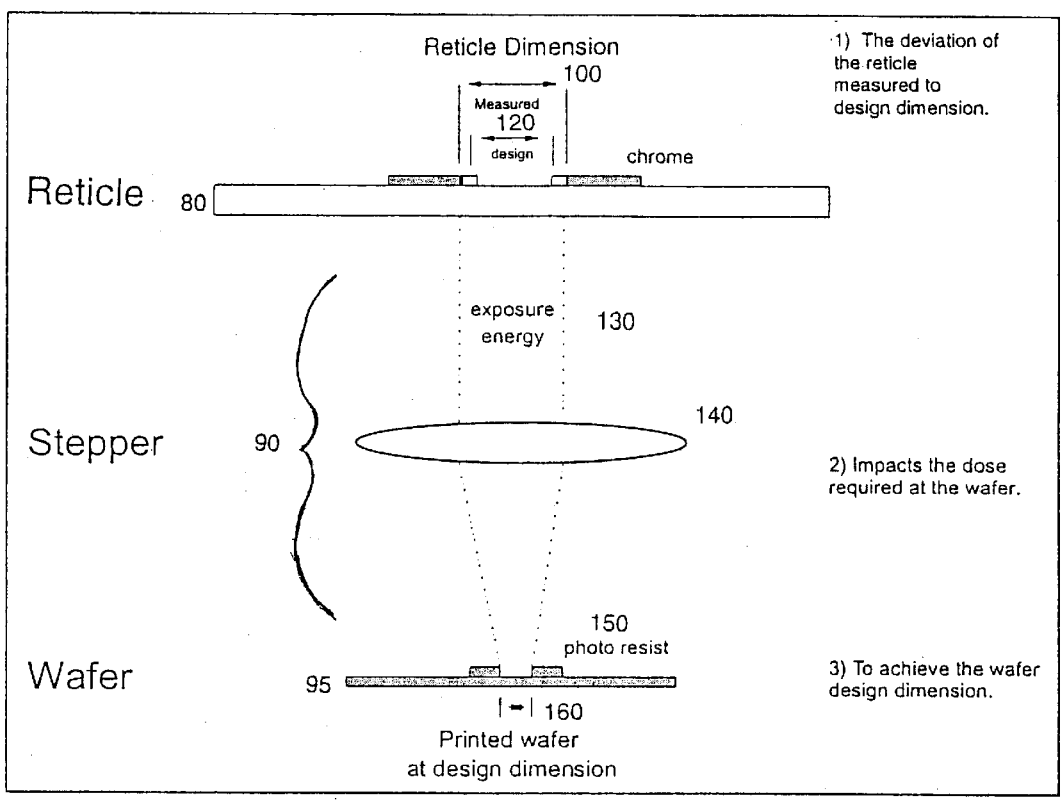
FIG. 1 depicts the main components of a photolithographic processing system representing the environment of Applicants' invention.
Figure 2:
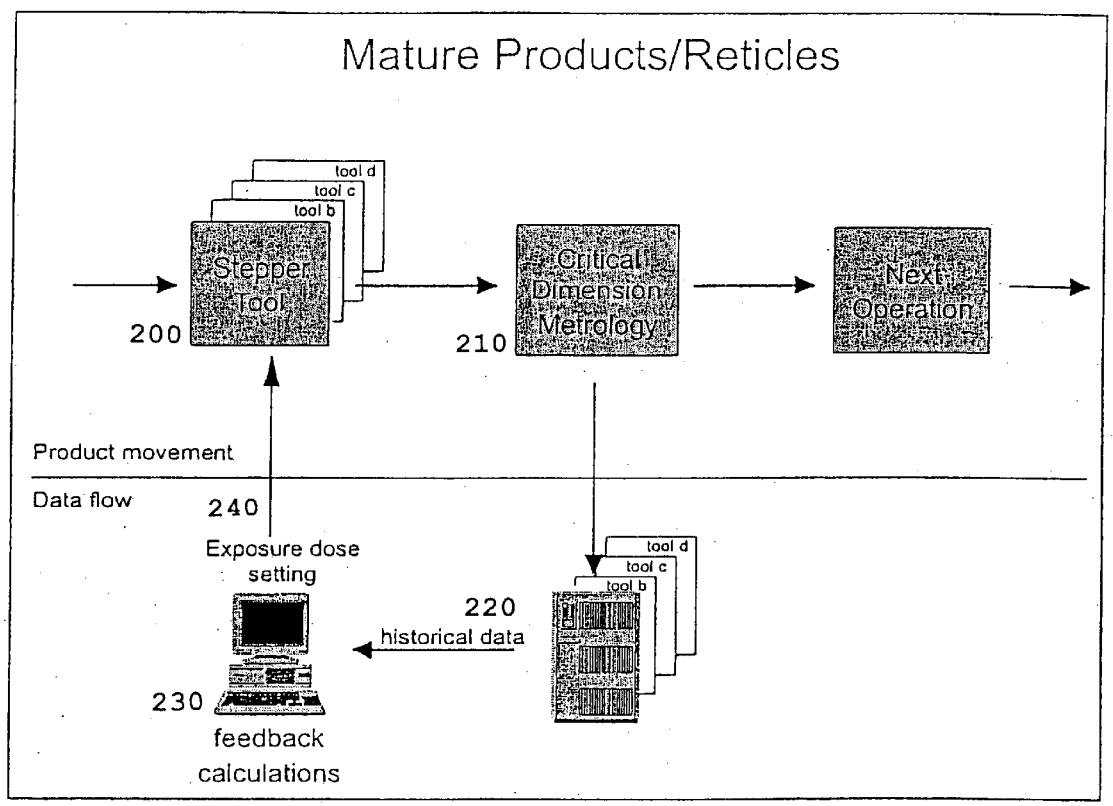
FIG. 2 illustrates the CD metrology and historical data feedback loop for setting an exposure dose setting.
Figure 3:
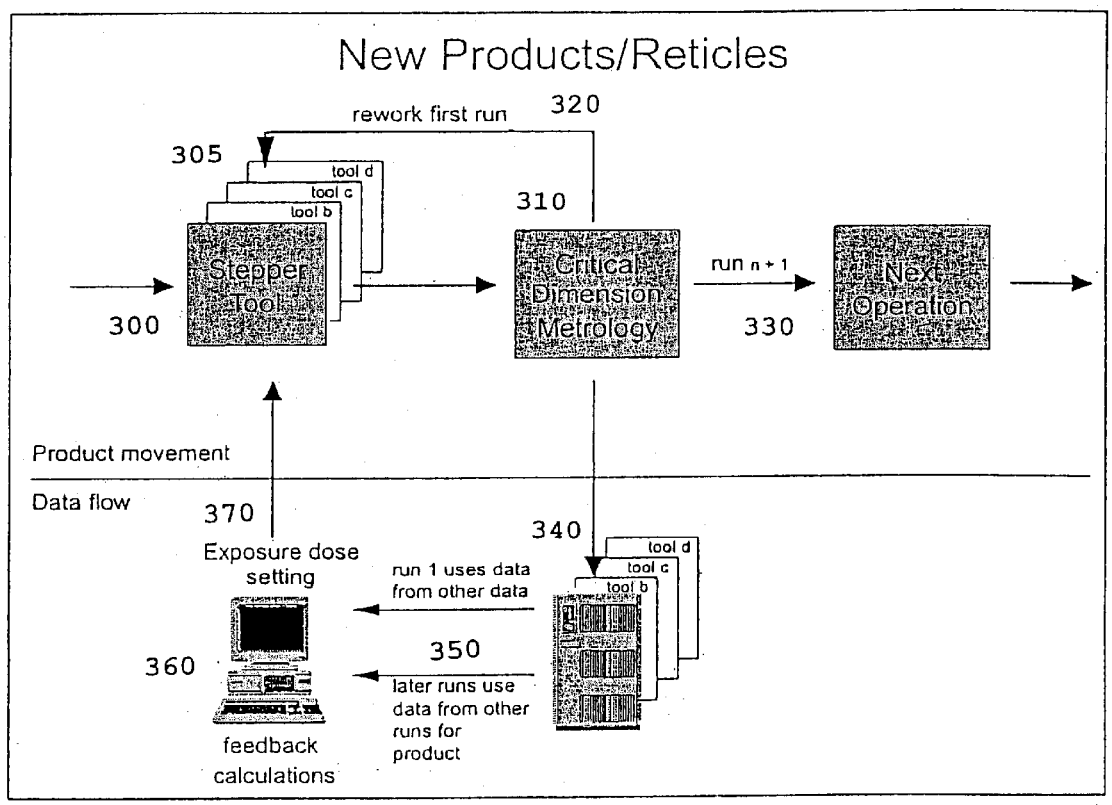
FIG. 3 shows prior art method for determining an initial exposure dose setting.

It is noted that the present invention may be used in photolithographic techniques including proximity printing as well as projection printing. However any conventional photo-optical exposure system may be employed with the present invention. Notwithstanding which printing technique is employed, the system described in FIG. 4 includes a reticle having an image. The reticle may comprise any conventional mask (FIG. 1, 80), including chrome on quartz or an attenuating phase shift mask, which includes at least one feature. A tool, such as stepper exposure tool (FIG. 4, 410) is additionally provided for focusing energy directed through the reticle onto a photoresist treated semiconductor wafer.

Additionally, a computer with non-volatile, i.e. hard drive, storage capability is provided (FIG. 4, 460) for performing the reticle factor and optimum dose calculations required to produce an exposure dose setting. The storage is used for maintaining a database (FIG. 4, 430, 440) with the relevant historical wafer production data stored therein, including but not limited to reticle dimension data, reticle factors, historical wafer exposure conditions and historical wafer dimension data. The computer executes all processing necessary to support required database access, dose and reticle factor calculations. The computer (FIG. 4, 460) may also be provided with an interface for sending the exposure dose setting (FIG. 4, 470) to the stepper exposure tool (FIG. 4, 410) for exposure control.

As historical wafer production data are obtained, reticle factors are computed and stored for each reticle used. In a preferred embodiment, this factor is a relationship expressed as a ratio of the required exposure conditions, i.e. the exposure energy (FIG. 1 130) of a particular reticle to meet a target wafer dimension, i.e. OptimumDose$_{current}$ reticle vs. the average required exposure conditions of similar reticles to achieve the same target wafer dimension, i.e., wafer design dimension. Specifically the formula for a calculated reticle factor is:

reticle factor=OptimumDose$_{current\ reticle}$/($_1\Sigma^n$OptimumDose$_{other\ similar\ reticle}$)/n where n=number of similar reticles, and the expression, ($_1\Sigma^n$ OptimumDose$_{similar\ reticle}$)/n represents the average exposure condition over n similar reticles.

Reticle factors are used to calculate new wafer exposure conditions in the absence of suitable recent historical wafer process data for a given reticle/tool combination. The formula governing the calculation of an exposure condition for a reticle missing suitable recent historical wafer process data, i.e., OptimumDose$_{reticle\ missing\ recent\ history}$, is:

OptimumDose$_{reticle\ missing\ recent\ history}$=($_1\Sigma^n$OptimumDose$_{similar\ reticles}$/n)*reticle factor.

These reticle factors, along with measured reticle dimensions and reticle design dimensions are used as inputs to the inventive CD control model algorithm performed at tool setup time when using a new reticle. In a preferred embodiment, the CD control model includes two components for performing the following functions:

1. Determining a derived reticle factor from correlation data comprising the ratio of reticle measured feature dimension and reticle design dimension vs. the calculated reticle factors.

2. Applying the derived reticle factor to wafer production using a new reticle.

On subsequent uses of the reticle, historical wafer exposure conditions and wafer dimension data with reticle factors are utilized to characterize current exposure conditions, i.e. the most recent historical data is made available to ensure a more accurate dose estimation from the control algorithm.

As shown in FIG. 4, the feedback calculations 450, are modified by the reticle CD measured vs. design data 440 to determine exposure settings that compensate for manufactured reticle deviations from reticle design dimensions. A relationship between the reticle measured dimension and the reticle design dimension is obtained for correlation with reticle factors. In a preferred embodiment, a measure of the manufactured reticle deviation, i.e. size deviation, comprises the ratio of the reticle measured dimension to the reticle design dimension. The required calculations for determining optimum dose, calculated reticle factors, correlation data and derived reticle factors are performed by computer 460.

As stated above, the reticle factor is used in the computation of exposure conditions in the absence of suitable recent historical wafer dimension and exposure condition data. The new exposure condition is calculated as a function of the feedback control loop optimized Dose and reticle factor.

When a new reticle is introduced, a derived reticle factor, "derived reticle factor", is determined from a correlation between the ratio of actual, i.e. measured feature dimensions/size deviations and design dimensions of other reticles used in production vs. their calculated reticle factors. The population of size deviations, i.e., measured feature dimension divided by design dimension, and reticle factors used are limited to a corresponding population of reticles for a given wafer design dimension. The derived factor is used as an initial reticle factor to determine the proper exposure conditions of the new reticle, and is updated as production wafer data is obtained. The OptimumDose$_{current\ reticle}$ is a corrected dose/exposure condition for a current wafer design dimension using the feedback exposure control loop. Once the calculated reticle factors are available for the desired population of similar reticles, the correlation is made between the size deviations and the calculated reticle factors. As stated above, the derived reticle factor is determined from the size deviation vs. calculated reticle factors correlation. Subsequently, an Optimum Dose for the new reticle is calculated according to the equation:

$$\text{OptimumDose}_{new\ reticle} = (_1\Sigma^n \text{OptimumDose}_{similar\ reticle}/n)*\text{derived reticle factor.}$$

Figure 5:
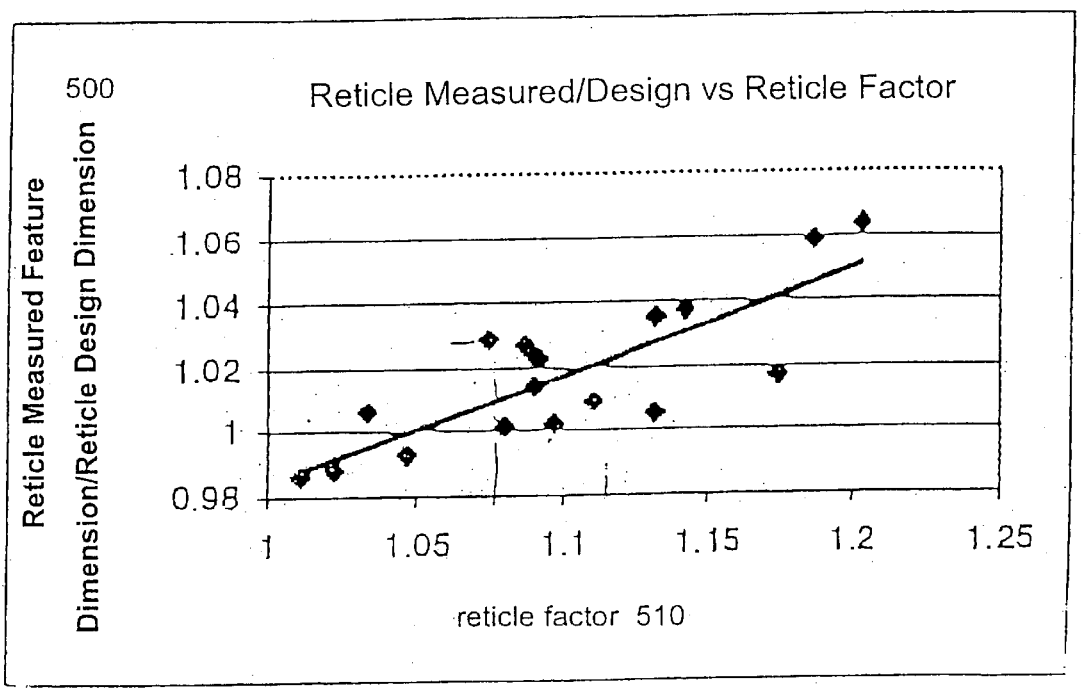
FIG. 5 is a graphical depiction of the Reticle measured/design vs. Reticle factor.

FIG. 5 illustrates the reticle measurements vs. reticle factor plot. The correlation between the reticle size deviation as vertical coordinate, i.e., reticle$_{measured\ feature\ dimension}$/reticle$_{design\ dimension}$ (FIG. 5, 500) versus the reticle factor (FIG. 5, 510) as horizontal coordinate is plotted using well-known regression techniques such as a least squares polynomial curve fitting method.

The reticle factor, i.e., derived reticle factor, is then seeded into the feedback control loop before the new reticle is ever used. Therefore the control system uses the derived reticle factor for the new reticle even though the new reticle has no history in the system.

Thus, the present technique can achieve target CD in the first pass for a reticle with a previous history of use in the system as well as a new reticle with no history data.

While this invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms described and illustrated, but fall within the scope of the appended claims.

Having thus described our invention, what we claim as new and desire to secure by Letters Patent is:

1. A method for determining an initial exposure condition for a new reticle implemented in a lithography tool for achieving a wafer design dimension, said new reticle having a known reticle design dimension and a known reticle measured feature dimension, said method comprising the steps of:

a) recording said reticle design dimension and said reticle measured feature dimension of said new reticle in a memory storage device, said memory storage device further storing:
  i.) reticle dimension data from other reticles; and,
  ii.) exposure conditions of past wafers when implementing said other reticles; and,
     resulting wafer feature dimensions of said past wafers when exposed using said other reticles;

b) recording a first relationship between said reticle measured feature dimension of said new reticle and said reticle design dimension of said new reticle as one of a plurality of size deviations in said memory storage device, said plurality of size deviations comprising said first relationship for each of said other reticles;

c) for each of a plurality of said other reticles, calculating a reticle factor comprising a second relationship between said exposure conditions required to meet said wafer design dimension using said each of a plurality of said other reticles and average exposure conditions of similar reticles required to meet said wafer design dimension to thereby create a plurality of calculated reticle factors;

d) determining a derived reticle factor (derived reticleFactor) for said new reticle by correlating a first population of said plurality of size deviations to a second population of said plurality of calculated reticle factors;

e) calculating an initial exposure condition (OptimumDose$_{new\ reticle}$) for said new reticle by using said derived reticle factor; and, f) applying said initial exposure condition to said new reticle during manufacturing of said semiconductor device, whereby said wafer design dimension is achieved.

2. The method of claim 1, wherein said new reticle is a quartz-chrome reticle.

3. The method of claim 1, wherein said new reticle is a phase shift reticle.

4. The method of claim 1, further comprising the step of recording said initial exposure condition for said new reticle in said memory storage device.

5. The method of claim 1, further comprising the step of recording said wafer feature dimensions of a wafer exposed with said new reticle in said memory storage device.

6. The method of claim 1, wherein said second relationship is determined according to:

$$\text{OptimumDose}_{current\ reticle}/((_1\Sigma^n \text{OptimumDose}_{similar\ reticle})/n)$$

wherein:

OptimumDose$_{current\ reticle}$ is a corrected exposure condition for the current wafer design dimension of a reticle currently being used other than said new reticle; and, ($_1\Sigma^n$OptimumDose$_{similar\ reticle}$)/n) is the corrected exposure condition for the current wafer design dimension averaged over n similar reticles.

7. The method of claim 1, wherein said first relationship represents a ratio of said reticle measured feature dimension to said reticle design dimension.

8. The method of claim 1, wherein said derived reticle factor determination step further comprises: generating a function relating said first relationship of said similar reticles and said calculated reticle factors of said similar reticles used in production; and; utilizing said function to determine said derived reticle factor from said known reticle measured feature dimension and the reticle design dimension of said new reticle.

9. The method of claim 8, wherein said function comprises a least squared polynomial curve fit relating said first relationship of said similar reticles and said calculated reticle factors.

10. The method of claim 1, wherein said step of calculating an initial exposure condition is governed according to the equation, $$\text{OptimumDose}_{new\ reticle} = (_1\Sigma^n\text{OptimumDose}_{similar\ reticle}/n) * \text{derived reticleFactor}.$$

11. A computer program product comprising: a computer usable medium having computer readable program code embodied therein for controlling a process for determining an initial exposure condition for a new reticle implemented in a lithography tool for achieving a wafer design dimension, said new reticle having a known reticle design dimension and a known reticle measured feature dimension, the computer program product comprising:
  a) first computer readable program code for causing a computer to record said said reticle design dimension and said reticle measured feature dimension of said new reticle in a memory storage device, said memory storage device further storing:
    i.) reticle dimension data from other reticles; and,
    ii.) exposure conditions of past wafers when implementing said other reticles; and, resulting wafer feature dimensions of said past wafers when exposed using said other reticles;
  b) second computer readable program code for causing the computer to record a first relationship between said reticle measured feature dimension of said new reticle and said reticle design dimension of said new reticle as one of a plurality of size deviations in said memory storage device, said plurality of size deviations comprising said first relationship for each of said other reticles;
  c) third computer readable program code for causing the computer to calculate, for each of a plurality of said other reticles, a reticle factor comprising a second relationship between said exposure conditions required to meet said wafer design dimension using said each of a plurality of said other reticles and average exposure conditions of similar reticles required to meet said wafer design dimension to thereby create a plurality of calculated reticle factors
  d) fourth computer readable program code for causing the computer to determine a derived reticle factor (derived reticleFactor) for said new reticle by correlating a first population of said plurality of size deviations to a second population of said plurality of calculated reticle factors;
  e) fifth computer readable program code for causing the computer to calculate an initial exposure condition (OptimumDose$_{new\ reticle}$) for said new reticle by using said derived reticle factor; and,
  f) sixth computer readable program code for causing the computer to apply said initial exposure condition to said new reticle during manufacturing of said semiconductor device, whereby said wafer design dimension is achieved.

12. The computer program product of claim 11, further comprising:
  a) seventh computer readable program code for causing the computer to record said initial exposure condition for said new reticle in said memory storage device; and,
  b) eighth computer readable program code for causing the computer to record said wafer feature dimensions of a wafer exposed with said new reticle in said memory storage device.

13. The computer program product of claim 11, wherein said first relationship represents a ratio of said reticle measured feature dimension to said reticle design dimension.

14. The computer program product of claim 11, wherein said second relationship is determined according to:

$$\text{OptimumDose}_{current\ reticle}/((_1\Sigma^n\text{OptimumDose}_{similar\ reticle})/n)$$

wherein:

OptimumDose$_{current\ reticle}$ is a corrected exposure condition for the current wafer design dimension of a reticle currently being used other than said new reticle; and,
($_1\Sigma^n$OptimumDose$_{similar\ reticle}$)/n) is the corrected exposure condition for the current wafer design dimension averaged over n similar reticles.

15. The computer program product of claim 11, wherein said derived reticle factor determination step further comprises:
  generating a function relating said first relationship of said similar reticles and said calculated reticle factors of said similar reticles used in production; and;
  utilizing said function to determine said derived reticle factor from said known reticle measured feature dimension and the reticle design dimension of said new reticle.

16. The computer program product of claim 15, wherein said function comprises a least squared polynomial curve fit relating said first relationship of said similar reticles and said calculated reticle factors.

17. The computer program product of claim 11, wherein said step of calculating an initial exposure condition is governed according to the equation, $$\text{OptimumDose}_{new\ reticle} = (_1\Sigma^n\text{OptimumDose}_{similar\ reticle}/n) * \text{derived reticleFactor}.$$

18. A system for determining an initial exposure condition for a new reticle implemented in a lithography tool for achieving a wafer design dimension, said new reticle having a known reticle design dimension and a known reticle measured feature dimension, said system comprising:
  a) means for recording said reticle design dimension and said reticle measured feature dimension of said new reticle in a memory storage device, said memory storage device further storing:
    i.) reticle dimension data from other reticles; and,
    ii.) exposure conditions of past wafers when implementing said other reticles; and,
      resulting wafer feature dimensions of said past wafers when exposed using said other reticles;
  b) means for recording a first relationship between said reticle measured feature dimension of said new reticle and said reticle design dimension of said new reticle as one of a plurality of size deviations in said memory storage device, said plurality of size deviations comprising said first relationship for each of said other reticles;

c) means for calculating, for each of a plurality of said other reticles, a reticle factor comprising a second relationship between said exposure conditions required to meet said wafer design dimension using said each of a plurality of said other reticles and average exposure conditions of similar reticles required to meet said wafer design dimension to thereby create a plurality of calculated reticle factors;

d) means for determining a derived reticle factor (derived reticleFactor) for said new reticle by correlating a first population of said plurality of size deviations to a second population of said plurality of calculated reticle factors;

e) means for calculating an initial exposure condition for said new reticle by using said derived reticle factor; and, f) means for applying said initial exposure condition to said new reticle during manufacturing of said semiconductor device, whereby said wafer design dimension is achieved.

19. The system of claim 18, wherein said second relationship is determined according to:

$$\text{OptimumDose}_{current\ reticle} / ((_1\Sigma^n \text{OptimumDose}_{similar\ reticle})/n)$$

wherein:

$\text{OptimumDose}_{current\ reticle}$ is a corrected exposure condition for the current wafer design dimension of a reticle currently being used other than said new reticle; and, $(_1\Sigma^n \text{OptimumDose}_{similar\ reticle})/n)$ is the corrected exposure condition for the current wafer design dimension averaged over n similar reticles, said system further comprising:

means for generating a function relating said first relationship of said similar reticles and said calculated reticle factors of said similar reticles used in production, said means further utilizing said function to determine said derived reticle factor from said known reticle measured feature dimension and the reticle design dimension of said new reticle.

20. The system of claim 18, wherein said initial exposure condition is governed according to an equation:

$$\text{OptimumDose}_{new\ reticle} = (_1\Sigma^n \text{OptimumDose}_{similar\ reticle}/n) * \text{derived reticleFactor}.$$

* * * * *